US011460488B2

(12) United States Patent
Dent

(10) Patent No.: US 11,460,488 B2
(45) Date of Patent: Oct. 4, 2022

(54) AC ELECTRICAL POWER MEASUREMENTS

(71) Applicant: Koolbridge Solar, Inc., Wrightsville Beach, NC (US)

(72) Inventor: Paul Wilkinson Dent, Pittsboro, NC (US)

(73) Assignee: KOOLBRIDGE SOLAR, INC., Wrightsville Beach, NC (US)

( * ) Notice: Subject to any disclaimer, the term of this patent is extended or adjusted under 35 U.S.C. 154(b) by 1308 days.

(21) Appl. No.: 15/676,826

(22) Filed: Aug. 14, 2017

(65) Prior Publication Data
US 2019/0049493 A1 Feb. 14, 2019

(51) Int. Cl.
G01R 21/133 (2006.01)
G01R 19/25 (2006.01)
G01R 19/00 (2006.01)
G01R 15/20 (2006.01)

(52) U.S. Cl.
CPC ......... G01R 21/133 (2013.01); G01R 15/202 (2013.01); G01R 19/003 (2013.01); G01R 19/2506 (2013.01); G01R 21/1331 (2013.01)

(58) Field of Classification Search
CPC .................................................. G01R 21/133
See application file for complete search history.

(56) References Cited

U.S. PATENT DOCUMENTS 3,340,457 A 9/1967 Schmitz
3,805,141 A 4/1974 Pompa, Jr. et al.
3,958,174 A 5/1976 Studtmann et al.
4,084,220 A 4/1978 Akamatsu
(Continued)

FOREIGN PATENT DOCUMENTS

CN 101350569 A 1/2009
CN 202444440 U 9/2012
(Continued)

OTHER PUBLICATIONS

Intersil, George E. Danz, HIP4080, 80V High Frequency H-Bridge Driver, Application Note. AN9324.4, Mar. 2003.

Primary Examiner — John E Breene
Assistant Examiner — Jeffrey C Morgan
(74) Attorney, Agent, or Firm — Coats & Bennett, PLLC

(57) ABSTRACT

An electrical measurement device for monitoring the current and power taken by a plurality of electrical loads that may be powered by a selected one of multiple AC power sources comprises sampling the voltage of said sources and the current taken by said loads at a integral number of samples per cycle at sample times determined by an independent processor clock. The integral number of samples of each measured parameter for each cycle are processed to determine a complex number for each parameter representative of the amplitude and the phase relative to the independent processor clock. The phase drift of the substantially constant source voltages may be determined as a measure of frequency of the sources, and may be used to cancel drift of the current measurement to enable averaging. When the source feeding a load is changed, the phase drift is removed from its current measurement by selecting the voltage samples of the source now feeding it to use for drift cancellation or for average power computation and cumulative energy computation.

11 Claims, 5 Drawing Sheets

(56) References Cited

U.S. PATENT DOCUMENTS

| | | | |
|---|---|---|---|
| 4,180,853 | A | 12/1979 | Scorso, Jr. et al. |
| 4,204,268 | A | 5/1980 | Vivirito |
| 4,320,449 | A | 3/1982 | Carroll |
| 4,803,611 | A | 2/1989 | Sashida et al. |
| 4,882,120 | A | 11/1989 | Roe et al. |
| 5,226,077 | A | 7/1993 | Lynn et al. |
| 5,270,636 | A | 12/1993 | Lafferty |
| 5,373,433 | A | 12/1994 | Thomas |
| 5,424,894 | A | 6/1995 | Briscall et al. |
| 5,479,086 | A | 12/1995 | Konstanzer |
| 5,499,178 | A | 3/1996 | Mohan |
| 5,625,276 | A | 4/1997 | Scott et al. |
| 5,680,302 | A | 10/1997 | Iwata et al. |
| 5,714,869 | A | 2/1998 | Tamechika et al. |
| 5,726,505 | A | 3/1998 | Yamada et al. |
| 5,898,585 | A | 4/1999 | Sirichote et al. |
| 5,930,128 | A | 7/1999 | Dent |
| 5,991,645 | A | 11/1999 | Yuen et al. |
| 6,051,954 | A | 4/2000 | Nagao et al. |
| 6,154,379 | A | 11/2000 | Okita |
| 6,545,885 | B2 | 4/2003 | Nishimura et al. |
| 6,545,887 | B2 | 4/2003 | Smedley et al. |
| 6,930,897 | B2 | 8/2005 | Jungreis et al. |
| 7,057,485 | B2 | 6/2006 | Preusse et al. |
| 7,082,040 | B2 | 7/2006 | Raddi et al. |
| 7,138,730 | B2 | 11/2006 | Lai |
| 7,339,287 | B2 | 3/2008 | Jepsen et al. |
| 7,411,802 | B2 | 8/2008 | Victor et al. |
| 7,474,016 | B2 | 1/2009 | Wang et al. |
| 7,616,467 | B2 | 11/2009 | Mallwitz |
| 7,710,752 | B2 | 5/2010 | West |
| 7,817,450 | B2 | 10/2010 | Fornage |
| 7,843,714 | B2 | 11/2010 | Bremicker et al. |
| 7,957,168 | B2 | 6/2011 | Zacharias et al. |
| 8,023,288 | B2 | 9/2011 | Engel et al. |
| 8,184,460 | B2 | 5/2012 | O'Brien et al. |
| 8,278,892 | B2 | 10/2012 | Friebe et al. |
| 8,441,820 | B2 | 5/2013 | Shen et al. |
| 8,456,865 | B1 | 6/2013 | Bianchi et al. |
| 8,482,155 | B2 | 7/2013 | Choi et al. |
| 8,582,331 | B2 | 11/2013 | Frisch et al. |
| 8,736,102 | B1 | 5/2014 | Gao et al. |
| 8,736,111 | B2 | 5/2014 | Song et al. |
| 8,837,178 | B2 | 9/2014 | Fornage |
| 8,891,211 | B2 | 11/2014 | Dent |
| 8,937,822 | B2 | 1/2015 | Dent |
| 8,963,372 | B2 | 2/2015 | Takano et al. |
| 8,963,512 | B2 | 2/2015 | Takano |
| 9,048,740 | B2 | 6/2015 | Gray et al. |
| 9,093,922 | B2 | 7/2015 | Ceu |
| 9,172,296 | B2 | 10/2015 | Seymour et al. |
| 9,263,183 | B2 | 2/2016 | Chapman et al. |
| 9,455,645 | B1 | 9/2016 | Zhou et al. |
| 9,583,946 | B2 | 2/2017 | Fornage |
| 9,735,703 | B2 * | 8/2017 | Dent ................. H02M 1/32 |
| 9,806,628 | B2 | 10/2017 | Chapman et al. |
| 10,180,695 | B1 | 1/2019 | Bikulcius |
| 2002/0047455 | A1 | 4/2002 | Dhyanchand et al. |
| 2003/0094929 | A1 | 5/2003 | Pendell |
| 2003/0094931 | A1 | 5/2003 | Renyolds |
| 2003/0169548 | A1 | 9/2003 | Clarey et al. |
| 2003/0179063 | A1 | 9/2003 | Preusse et al. |
| 2004/0100149 | A1 | 5/2004 | Lai |
| 2005/0001598 | A1 | 1/2005 | Belokon et al. |
| 2005/0056021 | A1 | 3/2005 | Belokon et al. |
| 2005/0073292 | A1 | 4/2005 | Hastings et al. |
| 2005/0139259 | A1 | 6/2005 | Steigerwald et al. |
| 2005/0174813 | A1 | 8/2005 | Dou et al. |
| 2005/0180083 | A1 | 8/2005 | Takahara et al. |
| 2005/0275386 | A1 | 12/2005 | Jepsen et al. |
| 2006/0158037 | A1 | 7/2006 | Danley et al. |
| 2007/0047277 | A1 | 3/2007 | Konishi et al. |
| 2007/0095062 | A1 | 5/2007 | Chertok |
| 2007/0292724 | A1 | 12/2007 | Gilchrist |
| 2008/0291706 | A1 | 11/2008 | Seymour et al. |
| 2009/0003024 | A1 | 1/2009 | Knaup |
| 2009/0073726 | A1 | 3/2009 | Babcock |
| 2009/0103340 | A1 | 4/2009 | Bremicker et al. |
| 2009/0161392 | A1 | 6/2009 | Zhang et al. |
| 2009/0184706 | A1 | 7/2009 | Duric et al. |
| 2009/0206666 | A1 | 8/2009 | Sella et al. |
| 2009/0244947 | A1 | 10/2009 | Fornage |
| 2009/0296434 | A1 | 12/2009 | De Rooij et al. |
| 2010/0064424 | A1 | 3/2010 | Hsu et al. |
| 2010/0071744 | A1 | 3/2010 | Peurach et al. |
| 2010/0091529 | A1 | 4/2010 | Jackman et al. |
| 2010/0135051 | A1 | 6/2010 | Mallwitz |
| 2011/0013438 | A1 | 1/2011 | Frisch et al. |
| 2011/0019316 | A1 | 1/2011 | Zhan et al. |
| 2011/0037600 | A1 | 2/2011 | Takehara et al. |
| 2011/0043160 | A1 | 2/2011 | Serban |
| 2011/0088741 | A1 | 4/2011 | Dunton et al. |
| 2011/0090607 | A1 | 4/2011 | Luebke et al. |
| 2011/0096581 | A1 | 4/2011 | Hallak |
| 2011/0140520 | A1 | 6/2011 | Lee |
| 2011/0140535 | A1 | 6/2011 | Choi et al. |
| 2011/0198936 | A1 | 8/2011 | Graovac et al. |
| 2011/0285354 | A1 | 11/2011 | Iwasa |
| 2011/0292705 | A1 | 12/2011 | Fornage |
| 2011/0301772 | A1 | 12/2011 | Zuercher et al. |
| 2012/0007459 | A1 | 1/2012 | Mondal et al. |
| 2012/0048325 | A1 | 3/2012 | Matsuo et al. |
| 2012/0049637 | A1 | 3/2012 | Teichmann et al. |
| 2012/0112557 | A1 | 5/2012 | Sager |
| 2012/0113695 | A1 | 5/2012 | Chivite Zabalza et al. |
| 2012/0113696 | A1 | 5/2012 | Voigtlaender |
| 2012/0228938 | A1 | 9/2012 | Thieringer et al. |
| 2012/0242145 | A1 | 9/2012 | Espeut, Jr. |
| 2012/0281444 | A1 | 11/2012 | Dent |
| 2013/0057997 | A1 | 3/2013 | Dent |
| 2013/0058144 | A1 | 3/2013 | Hiramatsu et al. |
| 2013/0070494 | A1 | 3/2013 | Rotzoll |
| 2013/0155741 | A1 | 6/2013 | Takano |
| 2013/0181655 | A1 | 7/2013 | Yokoyama et al. |
| 2013/0181703 | A1 | 7/2013 | Ausserlechner |
| 2013/0245614 | A1 | 9/2013 | Seebruch |
| 2013/0320929 | A1 | 12/2013 | Walker et al. |
| 2013/0322136 | A1 | 12/2013 | Ceu |
| 2014/0049198 | A1 | 2/2014 | Ooyama et al. |
| 2014/0062206 | A1 | 3/2014 | Bryson |
| 2014/0084687 | A1 | 3/2014 | Dent |
| 2014/0084702 | A1 | 3/2014 | Chapman et al. |
| 2014/0153303 | A1 | 6/2014 | Potharaju |
| 2014/0266289 | A1 | 9/2014 | Della Sera et al. |
| 2015/0008748 | A1 | 1/2015 | Deboy et al. |
| 2015/0043110 | A1 | 2/2015 | Dent |
| 2015/0207401 | A1 | 7/2015 | Zhang et al. |
| 2015/0217656 | A1 | 8/2015 | Loftus et al. |
| 2015/0229131 | A1 | 8/2015 | Gerhardinger |
| 2015/0295413 | A1 | 10/2015 | Dent |
| 2015/0349708 | A1 | 12/2015 | Moslehi |
| 2016/0006244 | A1 * | 1/2016 | Aulagnier ................. H02J 3/00 307/52 |
| 2016/0036235 | A1 | 2/2016 | Getsla |
| 2016/0065090 | A1 | 3/2016 | Dent |
| 2016/0224083 | A1 | 8/2016 | Dent et al. |
| 2016/0226560 | A1 | 8/2016 | Dent |
| 2016/0261226 | A1 | 9/2016 | Hamilton et al. |
| 2016/0276837 | A1 | 9/2016 | Manjrekar |
| 2016/0372927 | A1 | 12/2016 | Dent |
| 2017/0346413 | A1 | 11/2017 | Dent |
| 2018/0006601 | A1 | 1/2018 | Dent |
| 2018/0026550 | A1 | 1/2018 | Dent |
| 2020/0006947 | A1 * | 1/2020 | Koeppe ................... H02J 3/381 |

FOREIGN PATENT DOCUMENTS

| | | |
|---|---|---|
| DE | 102008018497 A1 | 10/2009 |
| EP | 2544354 A2 | 1/2013 |
| EP | 2698894 A2 | 2/2014 |
| EP | 2053730 B1 | 6/2015 |
| EP | 2291906 B1 | 4/2016 |
| GB | 1433402 A | 4/1976 |
| GB | 2483879 B | 3/2012 |

(56) References Cited

FOREIGN PATENT DOCUMENTS

| | | |
|---|---|---|
| WO | 02093655 A1 | 11/2002 |
| WO | 2006081531 A2 | 8/2006 |
| WO | 2010061392 A1 | 6/2010 |
| WO | 2010130273 A1 | 11/2010 |
| WO | 2012054492 A1 | 4/2012 |
| WO | 2012066493 A2 | 5/2012 |
| WO | 2012105737 A1 | 8/2012 |
| WO | 2012140495 A2 | 10/2012 |
| WO | 2016033394 A1 | 3/2016 |
| WO | 2016204830 A1 | 12/2016 |

\* cited by examiner

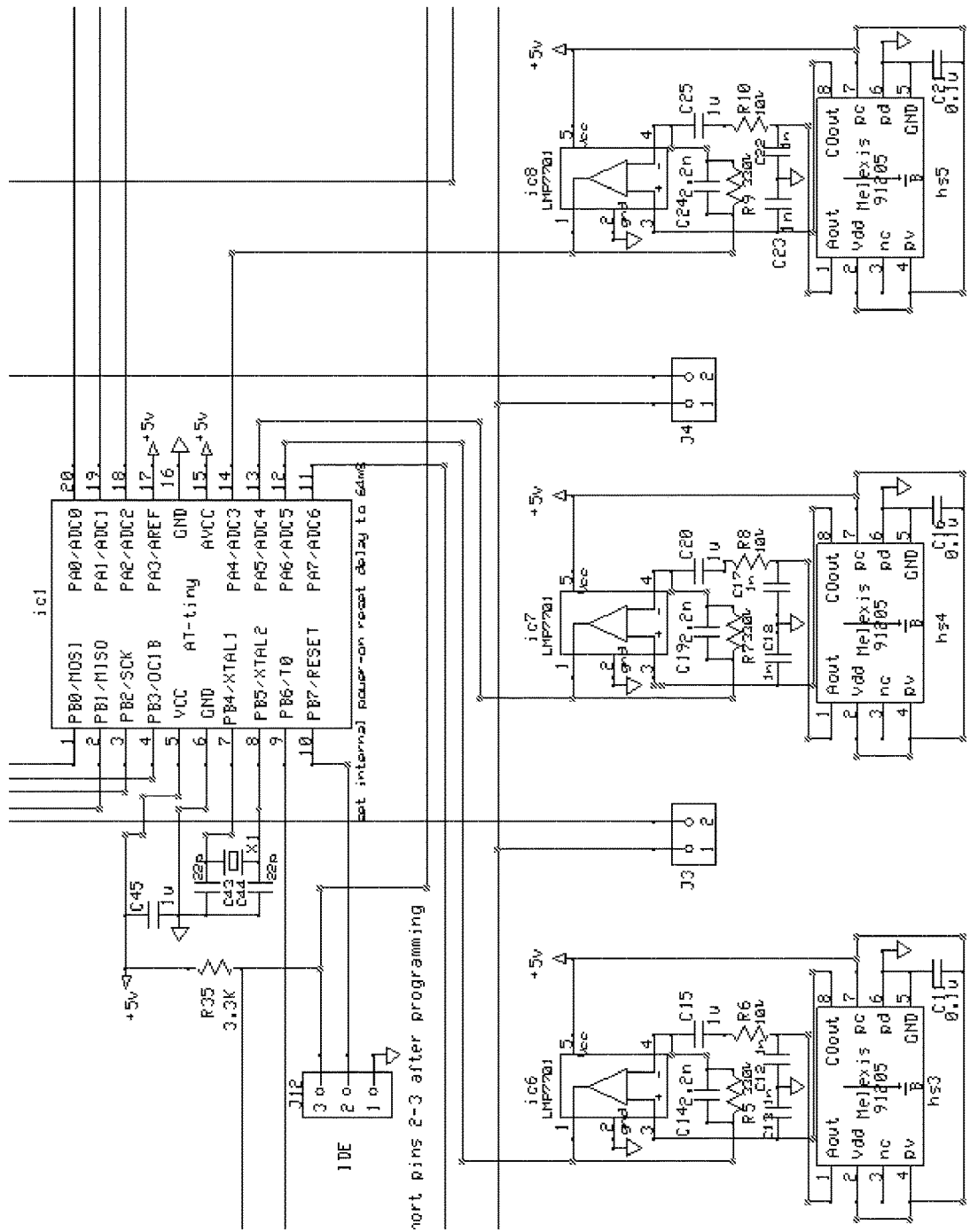
Figure 2: Suitable circuit for current sensing using Hall Effect sensors

```
SUBTRACT_INTO_BUFFER:
    100  IN    R16,ADCL    ; Get LSB of the 10-bit conversion
    101  LD    R17,Y       ; Y is used as the buffer pointer. Get LSB of previous
buffer value
    102  SUB   R16,R17     ; Subtract the new value from previous buffer value
    103  ST    Y+,R16      ; and store back in buffer
    104  IN    R16,ADCH    ; Get MSB of the 10-bit conversion
    105  LD    R17,Y       ; Get MSB of previous buffer value at Y
    106  SUBC  R16,R17     ; Subtract it with Borrow from previous SUB
    107  ST    Y+,R16      ; and store in buffer. The pointer has now move on two byte places
    108  ANDI  R28,$BF     ; Ensures the buffer Y = (R29,R28) is incremented modulo 64
    109  RET               ; Return from call
```

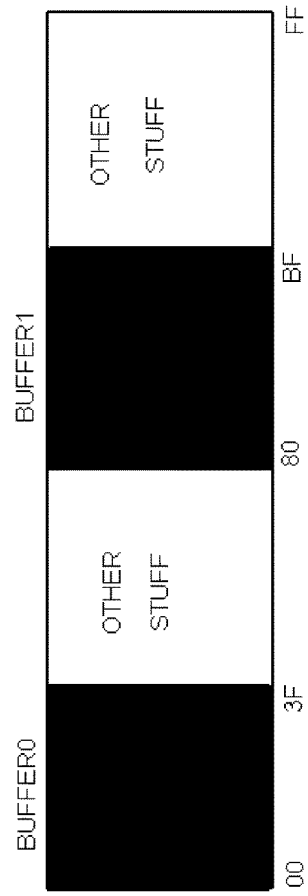

Figure 3: Forming differences on the fly

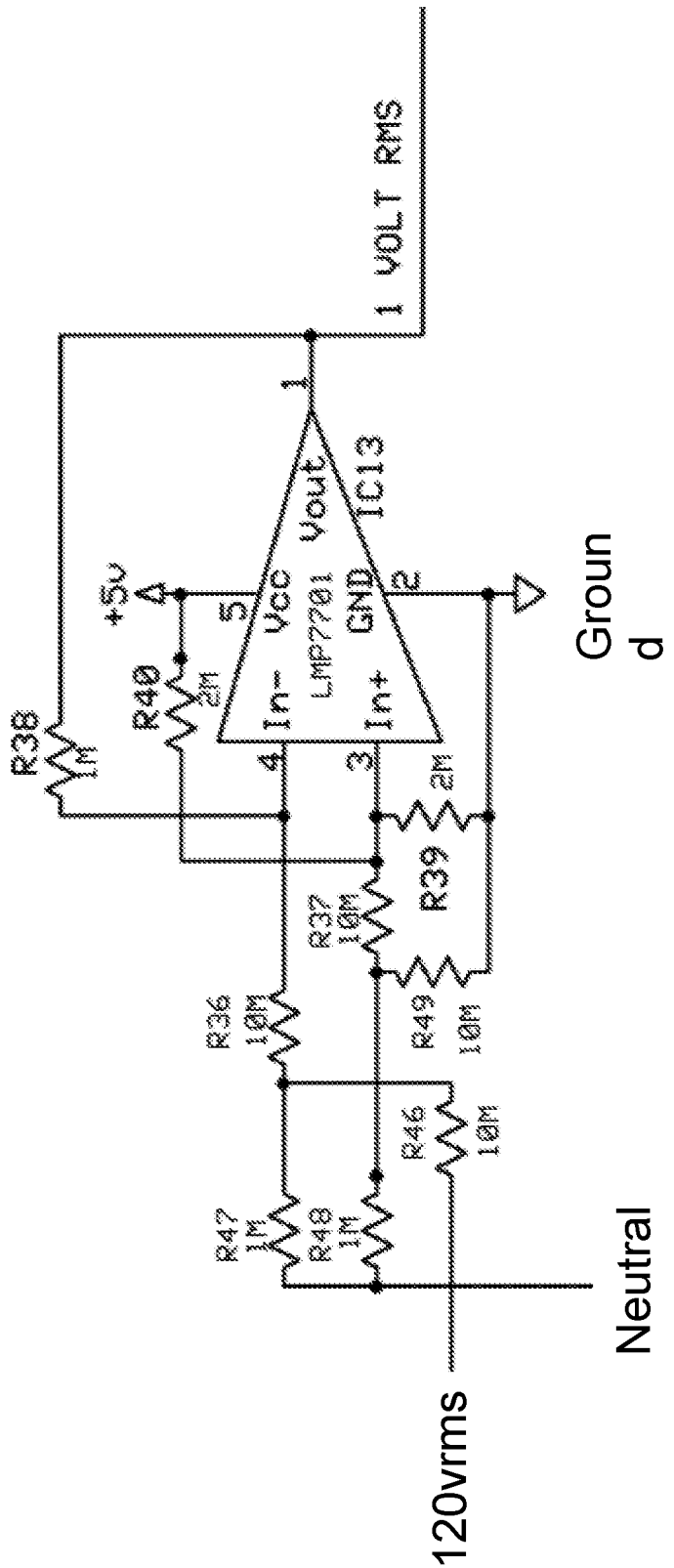
Figure 4: Voltage Measurement Circuit

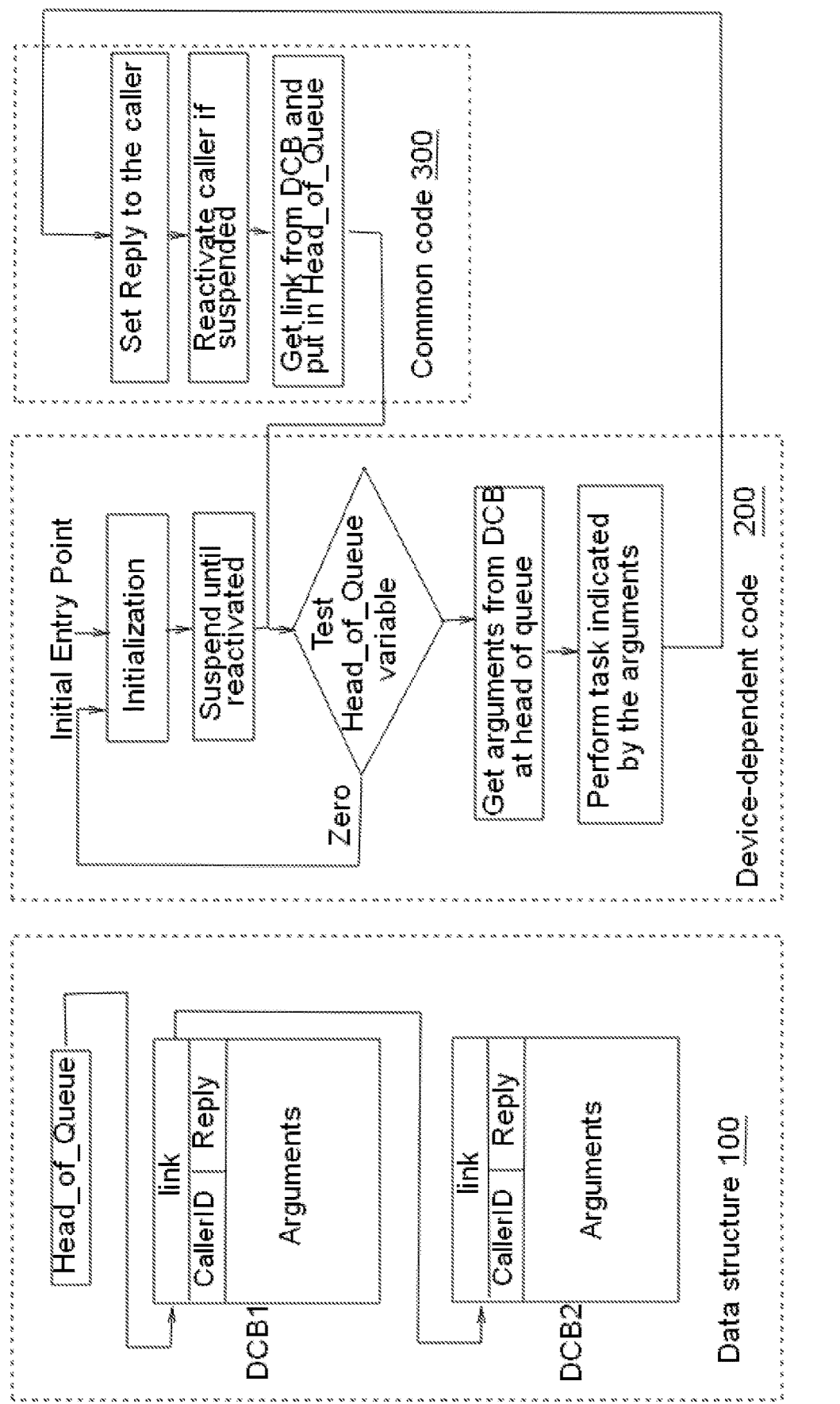
Figure 5: General Software Structure

AC ELECTRICAL POWER MEASUREMENTS

BACKGROUND

The present invention relates generally to the distribution of electricity and in particular to voltage, current, and power monitoring in systems having two or more different sources of alternating current power.

In systems such as described in U.S. Pat. No. 9,735,703, which is a continuation of U.S. Pat. No. 8,937,822, to Applicant, electrical loads may be fed with power selected from a first AC power source or a second AC power source in dependence on various considerations. Such considerations can include the state of the AC power source voltages, i.e., over or under voltage, frequency accuracy and the current or power taken by each load. Thus monitoring the power taken by each load, whichever source is feeding it, is a desired function. The above-mentioned '703 and '822 patents are hereby incorporated by reference herein in their entireties.

Two electrical power sources may or may not be exactly synchronized in frequency, but even if synchronized, may not be exactly in the same phase. When it is desired to monitor the voltage, current or power from two such sources using a common monitoring device such as a microprocessor, a dilemma arises as to from which one of the sources the microprocessor should take its timing. For example, the zero-crossings of the AC voltage of the first source could be used to interrupt a microprocessor to start sampling and Digital-to-Analog converting analog electrical parameters such as voltage and current during a cycle. However, one purpose in providing two alternate electrical sources is so that the second source continues to support operations if the first source is experiencing an outage. Thus synchronizing to one source or the other does not provide a continuous synchronization suitable for accurate monitoring. Therefore a solution is needed for configuring a processor to monitor electrical parameters of multiple sources that continues to operate smoothly across outages of either source.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

A microprocessor is provided with a crystal oscillator which is a large integer multiple of common power line frequencies, such as 50 and 60 Hz. 60 Hz is used as the exemplary frequency in further description below. The crystal oscillator frequency is divided down internally using a timer inside the microprocessor to provide an approximate 60 Hz tick, and at least one integer multiple thereof, such as 480 Hz. The internal 60 Hz is not synchronized to any power source and so drifts slowly in phase relative to the approximately 60 Hz frequencies of the multiple power sources. The power supply for the microprocessor is obtained by half-wave rectifying and diode-ORing every phase of every electrical source so that it continues to function even if all phase bar one have failed.

The microprocessor uses the internally generated clocks of 60 Hz and the multiple of 60 Hz to sample, or cause to sample, the currents and voltages desired to be measured and to analog-to-digital convert them to numerical sample values.

A set of numerical values for each voltage and current, approximately equally spaced in time over a cycle, are Fourier analyzed to determine the fundamental component of each for each complete cycle. The fundamental component so calculated is a complex number having a real part representative of the amplitude of a cosine wave component and an imaginary part representative of a sine wave component. The ratio of the sine to the cosine amplitudes is the tangent of the phase difference between the power source and the microprocessor's internally generated 60 Hz reference tick. The phase drifts at a rate depending on the frequency difference between the microprocessor's internal clock and the electrical power source being measured, and thus the frequency difference can be determined for each source relative to the microprocessor's reference, and thus also relative to each other, by determining for example the average phase change per cycle over several cycles.

To obtain an average value of a measured fundamental component of current or voltage, the per-cycle measured values are corrected for phase drift using the frequency so determined and then coherently averaged.

The power transferred to a load via a branch circuit fed with a substantially sinusoidal voltage is calculated as the average value of the per cycle complex current samples times the conjugate of the corresponding per cycle complex voltage samples, the phase drift on the conjugate of voltage being of equal and opposite sign to the phase drift of the current and thus canceling. The average value so obtained is used as a measure of real and reactive power and so also the power factor of the load is determined. A calibration procedure is implemented in production in which a known resistive load is used to determine and calibrate out any fixed phase differences between the measurement of current and voltage caused by small timing delays or phase changes in circuits and software, the calibration values being stored in non-volatile memory for each equipment.

When a load or branch circuit is switched to be powered from a second source instead of a first source, while the current measurement continues to supply samples of the load current, the selection of voltage samples with which it is combined must be switched to be taken from the second source instead of the first source. Moreover, the phase drift correction used to correct complex current values before averaging current may be determined by the phase drift of the voltage of the selected power source.

One embodiment relates to a system for monitoring the electrical parameters of a number of electrical loads or branch circuits, at least one of which may be powered at different times by a selected one of at least two AC power sources of nominally the same frequency. The system includes a clock generator operative to generate a local reference clock of nominally the same frequency as said at least two power sources or an integral multiple thereof; current sensors operative to sense the instantaneous current flowing in said loads or branch circuits and produce corresponding voltage waveforms; voltage scaling circuits operative to scale the voltage input from each of said at least two voltage sources to produce corresponding scaled voltages; analog to digital conversion circuits operative to convert said current corresponding waveforms and said scaled voltages to numerical values representing current and voltage measurement values at multiple samples per cycle, the AtoD conversion being triggered and synchronized by said clock generator; microprocessor circuits operative to control the selection of one of said at least two power circuits to power said at least one or load or branch circuit and to process said numerical values to obtain a complex number representing the phase and amplitude of a current or voltage over one or more power frequency cycles, said microprocessor circuits combining the complex number representative of a current value in a load or branch circuit with the complex value representative of the voltage value of the source selected to power said load or branch circuit in order to obtain the average or cumulative value of an electrical parameter of the load or branch circuit, and a power supply operative to convert power input from any or all of said at least two power sources or any phase thereof to a voltage suitable for powering said clock generator, current sensors, voltage scaling circuits, Analog to Digital conversion and microprocessor circuits.

Another embodiment relates to a method of determining the amount of energy consumed from the electricity grid by each of a number of branch circuits or loads and separately determining for the same branch circuits or loads the energy consumed from a solar energy source. A solar or utility indicator of the instantaneous source selected for each of said loads or branch circuits is maintained. The complex voltage of each of the utility and solar sources is measured using a locally generated phase or timing reference. The complex current flowing in each of said loads or branch circuits is measured using said same locally generated phase or timing reference. For each of said loads or branch circuits, said measured complex current is multiplied by the conjugate of said measured complex voltage of the source indicated by said indicator for each load or branch circuit to obtain an instantaneous power value. Said instantaneous power values for successive time instants are accumulated in a bin designated for solar if said indicator indicates the solar power source or alternatively in a bin designated for utility if said indicator indicates the utility power source, thereby obtaining for each load branch circuit a separate value for the energy consumed from solar and utility sources respectively.

Yet another embodiment relates to a method of determining an accurate average value of a complex AC current. A first complex number representative of AC current over one or more power frequency cycles is determined. A second complex number representative of the AC source voltage causing said current over one of more power frequency cycles is determined. A first average value is determined as the average of the product of said first complex number with the conjugate of said second complex number. A second average value is determined as the average value of said second complex number with the conjugate of itself. Said first average value is divided by the square root of said second average value to obtain said accurate average value of said complex AC current.

Still another embodiment relates to a method of determining an accurate average value of complex AC currents that can be drawn from any one of a number of AC voltage sources at different times. A first complex number representative of AC current over one or more power frequency cycles is determined. second complex numbers representative of each of said AC source voltages over one of more power frequency cycles are determined. The first complex number is multiplied by the conjugate of the second complex number associated with the source from which the current is momentarily drawn and accumulating the result in a first bin associated with that source. the second complex number associated with the source from which the current is momentarily drawn is multiplied by the conjugate of itself and the result is accumulated in a second bin associated with that source. The values in each of said first bins associated with a source are divided by the square root of the value in the corresponding second bin associated with the same source to obtain an accurate average value for said complex AC current drawn from each source.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

FIG. 2 shows a current sensing circuit using a Hall Effect sensor FIG. 3 shows a software arrangement for forming sample differences on the fly.

FIG. 4 shows a voltage measurement circuit

FIG. 5 shows a general software structure

DETAILED DESCRIPTION

Figure 1:
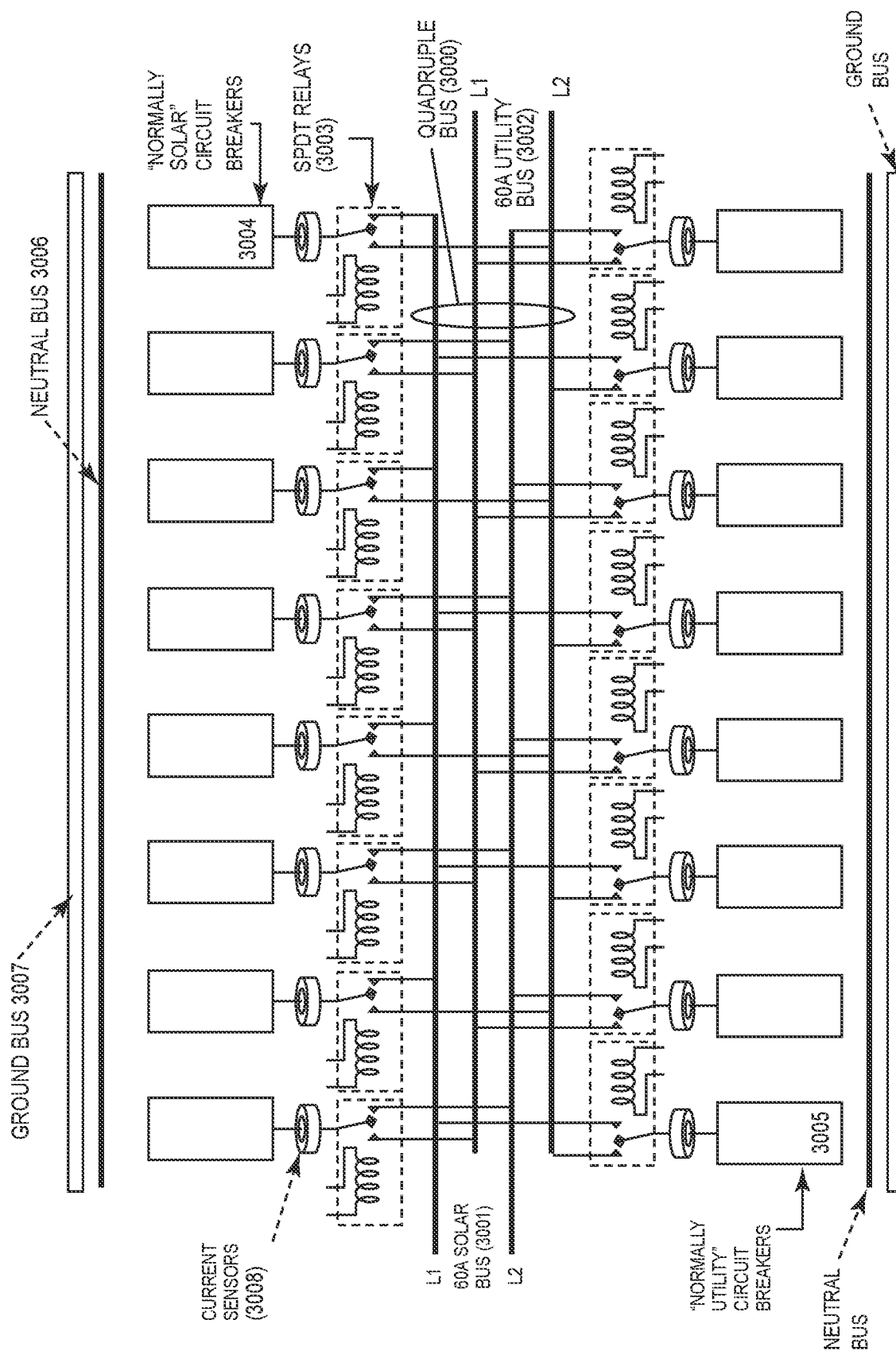
FIG. 1 shows an automatic circuit-by-circuit transfer switch panel according to the '884 application

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

FIG. 1 shows an automatic transfer switch panel for selecting, independently for each of a number of breaker-protected branch circuits, whether a branch circuit is powered by a first source, such as the electric utility grid, or a second source, such a DC-to-AC converter driven by a solar-charged storage battery. Such a panel provides an exemplary platform for describing the current invention; however, the invention is not limited to a system having only two sources, nor is it limited to the transfer switches for transferring between the multiple sources being collected together in a single panel.

In FIG. 1, current sensors (3008) sense the current delivered through each breaker to its load or branch circuit. The current is selected to have come from one or other of the quadruple bussbar lines (3001,3002) by an associated one of SPDT relays (3003). The phase of the current therefore depends on the phase of the voltage on the selected bussbar.

In the current invention, the AC voltage on each bussbar is measured. In an apparatus according to FIG. 1, the voltage on all four bussbars is preferably measured even when the voltages on pairs of the bussbars comes from a split-phase 120-0-120 volt source as used in the USA, as that can provide a useful indication of the failure of one phase. When one of the two phases of a split phase source fails, it is then desirable to avoid powering 240 volt loads from that source as they would then only receive 120 volts at best. Thus failure of one phase of one source is an indication that may used to effect automatic transfer of 240 volt loads to another source having both phases intact. A three-phase version having six bussbars can alternatively be envisaged, in which case all six voltages of the six bussbars would preferably be measured, and also used to power the electronics of the invention.

FIG. 4 shows a suitable voltage measurement circuit, of which there is one per phase and per source. The problem solved by this circuit is as follows:

The voltage to be measured on the Live wire of the phase, typically 120 volts rms, is to be potted down and level-shifted to the range typically accepted by low cost AtoD converter chips, for example to the range 0 to 5 volts. A suitable result of scaling down and level shifting would be to obtain an AC signal of 1 volt rms centered on 2.5 volts, which therefore swings between 1.1 and 3.9 volts with a nominal 120v rms input, leaving some headroom to correctly measure an overvoltage condition. Moreover, the AtoD, microprocessor and other low power electronics are preferably operating relative to ground, which is not exactly the same as neutral, even though neutral is grounded at the service entrance. Fault conditions can cause neutral to become live and even under normal conditions the voltage drop along the neutral line can be as much as 2.5% of the voltage, that is 3 volts rms. Thus if the scaling potentiometer chain comprises a pair of resistors in the ratio 119:1 between live and neutral, the result would be 1 volt rms plus the uncertain neutral voltage. On the other hand, if the scaling potentiometer chain comprised a pair of resistors in the ratio 119:1 between live and ground, that would inject a current into the ground or case of the apparatus, for which there are strict and very small safety limits. To keep the current down to the 1 uA level, potentiometer resistance values over 100 Mohms would be needed, which are vulnerable to change with exposure to moisture. To avoid the above pitfalls, the circuit of FIG. 4 performs the scaling in two steps. A first approximately 12:1 pot-down relative to neutral is performed by resistors R46 and R47. This results in approximately 10 volts RMS at the junction of R46,R47 and R36 relative to neutral. The voltage relative to ground is 10 volts RMS plus the neutral voltage. The 10:1 ratio of R36 to feedback resistor R38 then reduces this voltage by a further 10:1, obtaining 1 v rms at the Op-Amp output. To remove the uncertain neutral voltage and obtain an output referred to ground, the neutral voltage is scaled by a combination of R48, R49, R37 and (R39//R40) and applied to the opposite polarity input of the LMP7701 Op-amp, exactly canceling the contribution of the uncertain neutral voltage to the Op-Amp output. It may be seen that the current flowing from Live to ground has been kept to around the 1 uA level, and even this is largely canceled by the circuit attached to the opposite phase. Thus, by performing a scaling of the power line voltage to be measured in two steps, a first scaling relative neutral and a second scaling relative to ground, a voltage measurable by a grounded microprocessor circuit is obtained without injecting significant leakage current into the chassis of the apparatus.

To measure the current, current sensors (3008) may be toroidal magnetic cores through which the current-carrying conductor passes to form a 1-turn primary. A multi-turn secondary then produces an output voltage which is proportional to the derivative of the current. The derivative of the current is 90 degrees advanced compared with the current, and liable to be noisy due to magnification of noise at high frequencies relative to the power line frequency, and therefore requires low-pass filtering and phase correction by a process approximately equivalent to an integrator to cancel the differentiation. This filtering and phase adjustment may be carried out by hardware, digital signal processing software, or a combination.

Alternatively the current sensor may be a Hall Effect sensor such as the MLX92105 chip made by Melexis Microelectronic Integrated Systems. When a Hall Effect sensor is used, the current conductor is passed close to the sensor such that the magnetic field vector from the current carrying conductor penetrates the sensor in the direction of its greatest magnetic sensitivity. A Hall Effect sensor does not differentiate the current, but the small signal therefrom requires substantial amplification, adding noise, and may therefore still need filtering to reduce noise. A Hall Effect sensor is thus easier to use and simplifies manufacture by avoiding the need to thread a wire through a core, but either a Hall sensor or a coil pickup may be used.

FIG. 2 illustrates a segment from a suitable circuit that uses the above mentioned MLX92105 Hall Effect sensor. Three channels only are shown for simplicity. The important components that may be seen are the Melexis sensors at the bottom, an ATMEL AT-TINY microprocessor at the top having eight analog-to-digital conversion inputs, one of which is connected to the amplified output of each sensor, and the crystal X1 attached to the processor for providing a reference clock. A suitable reference clock frequency is 11.0592 MHz, which is 256×90×8×60 Hz. An internal power-of-2 prescaler may be set to divide the crystal frequency by 256 and then a programmable counter is set to count to 90 and then reset repeatedly, thus providing an 8×60 or 480 Hz internal timer interrupt, which occurs at intervals of 2.0833 milliseconds. Upon each interrupt, the AT-TINY's internal AtoD converter is triggered to convert the signal from each of eight current sensors in turn in rapid succession, which takes less than 1.5 milliseconds. The AC current signal from the Hall Effect sensors is biassed to be centered on +2.5 volts DC by a following amplifier that also attenuates noise below half and above twice the line frequency, and the gain of the amplifier is chosen to keep the output voltage within the 0 to 5 volt range of the AT-TINY's AtoD converter. The resulting converted, digitized samples are of 10-bit accuracy, and include the DC bias of 2.5 volts added to the AC current signal.

During most of the 1.5 mS time the AtoD converters are operating, the processor is actually free to do calculation, as it is also during the rest of the 2.08333 mS. The AtoD converter, once triggered, takes between 100 uS and 200 uS to perform a conversion, and then interrupts the processor when complete. The processor may perform on the order of 1000 instructions during this conversion time. When eight samples from each current sensor have been collected over one 60 Hz period of 8×2.08333=16.66 mS, these available CPU cycles for calculation while the next eight samples on each of the eight channels are being collected are sufficient to perform a simple Fourier analysis of the previously collected 8 samples on each channel to determine a complex number per channel per cycle indicative of amplitude and phase relative to the microprocessor's reference clock of the fundamental frequency components of each current. With the assumption that the voltage is sinusoidal, only the fundamental frequency component of the current at 60 Hz is needed to compute the power.

Fourier analysis of 8 samples per cycle to determine the fundamental component uses the equations:

$$\text{Cosine component} = (S1-S5)+(S2-S6-S4+S8)/\sqrt{2} \quad (1)$$

$$\text{Sine component} = (S3-S7)+(S2-S6+S4-S8)/\sqrt{2} \quad (2)$$

Equations (1) and (2) are seen to be based on four sample differences taken four apart, namely (S1-S5), (S2-S6), (S3-S7) and (S4-S8). The equations may thus be written in terms of the differences D1, D2, D3, D4 as follows:

$$\text{Cosine component} = D1+(D2-D4)/\sqrt{2} \quad (3)$$

$$\text{Sine component} = D3+(D2+D4)/\sqrt{2} \quad (4)$$

An efficient software code thus computes the four differences on the fly as samples are received by subtracting them from the samples received four ago and storing the differences in the same locations, thus halving the size of the RAM buffer required. Computing the differences also eliminates the DC bias.

FIG. 3 shows the software structure for forming and storing the above differences on the fly. The number of samples collected per cycle is 8 per channel, or 64 for 8 channels. Each sample is 10 bits long, requiring two bytes of storage. Therefore a one-cycle buffer size would normally be 128 bytes. However, by computing and storing only the four differences required, the buffer size reduces to 64 bytes. Two such buffers are required, as one is being used for calculation while the other is being filled. One buffer is shown occupying the address range 0 to 3F (hex) or 0000000 to 00111111 binary, and the second buffer occupies range 80 to BF (hex) or 1000000 to 10111111 binary.

The software uses register Y for addressing the buffers. Pointer Y is initialized to either 00000000 or 10000000 upon receiving a 60 Hz tick interrupt, depending on whether the first or second buffer is to be used. Also, the contents of the selected buffer are zeroed at the start.

At step 100, the least significant 8 bits of an AtoD conversion are read into R16.

At step 101, the current contents of buffer location Y are read into R17. First time round, this will be zero, but second time round it will the complement of the AtoD value from the first time round.

At step 102, the previous buffer value in R17 is subtracted from the LSB of the AtoD result in R16. R17 was zero the first time round so the result is simply the LSB R16 unchanged. This is rewritten to the buffer at step 103 and the buffer pointer Y is incremented.

At step 104 the MSB of the AtoD result is loaded into R16. At step 105, the next byte from the buffer is loaded into R17. This will be zero first time round also, but is the previous sample's MSB the second time round. At step 106, the previous buffer value in R17 is subtracted from the AtoD MSB in R16 with a Borrow from the LSB subtraction at step 102, and the result put back into the buffer at step 107. This completes dealing with a first result of AtoD conversion. The buffer pointer has moved on two bytes and now points to the previous result of the next channel. At step 108, it is ensured that bit 6 of the pointer Y remains at zero by ANDing BF (hex)=10111111 with Y's LSB, which is R28, so that it will not increment outside of the buffer area to which it was initialized. This process continues for the first 4 samples received on all 8 channels, the 32, 2-byte samples then filling the 64-byte buffer. The buffer pointer Y then wraps around so that the next 32 samples are subtracted from the first 32 samples, leaving four, 2-byte differences for all eight channels in the 64-byte buffer. The differences are actually the negative of the difference used in equations 3 and 4 above, but this may be trivially accounted for by later operations.

The four differences per channel are then processed as described above to determine a cosine and sine component for each channel while the second buffer is being filled during the next cycle, having initializing Y to 10000000 (hex 80). Actually, Y is alternated between the two buffers by, after each round, adding hex 80 to its LSB which toggles its most significant bit, thereby switching the buffer starting address alternately between 00000000 and 10000000.

Calculating sample differences cancels out the above-mentioned 2.5 volt DC bias, which is the same on all samples. Moreover, $1/\sqrt{2}$ is accurately approximated by 181/256. Thus division by $1/\sqrt{2}$ is accomplished by multiplying by 181 with a byte shift to the right, which equates to division by a denominator of 256. Since the multiplication is always by the same number 181/256, the result can be precomputed for every possible 8-bit multiplicand and stored in the processor's EPROM as a 256-element table of 2-byte products, thus reducing multiplication to table-lookup. Negative numbers are changed to positive numbers for multiplication and then the sign of the result changed to negative.

Two table look-ups are needed for multiplying a 16-bit value by 181 to give a 3-byte result, of which only the most significant two bytes are needed. The first table look-up uses the LSB of the 16 bits to get a 2-byte result, and the second table look-up uses the MSB. The first result is then added to the second result with a one byte relative displacement to get the three-byte result, only the most significant two bytes of which are used to complete the calculation of equations 3 and 4 to get 16-bit results for cosine and sine components, which are then passed to a main processor.

The main processor is for example an ATMEGA processor, which uses the same 11.0592 MHz crystal frequency to generate and supply a 60 Hz tick to the AT-TINY processor to trigger a new measurement sequence and to trigger output of the previous calculations. The ATMEGA processor measures the voltage from the circuits of FIG. 4 in the same way as described for the current to obtain a cosine and a sine component. The ATMEGA has a hardware multiplier that can be used to multiply by 181, which is a little faster than table lookup. Since the AT-TINY is synchronized to the same 60 Hz tick from the main processor, the phase reference is the same for voltage and current give or take some small, constant timing corrections that may be needed to be taken out by a one-time calibration. Communication between the AT-TINY and the main processor, which is an AT-MEGA 1284 in a prototype system, uses the Serial Peripheral Interface, or "SPI port" for short.

The voltage scaling circuit of FIG. 4 effectively measures line voltage alone. Line voltage alone, when combined with current, is more accurately representative of the power consumed from the source. The line-to-neutral voltage combined with current would be a correct estimate of the power taken by the load but an underestimate of the power consumed from the source, as it ignores the loss in the neutral wire, which has to be paid for. Also, without canceling the contribution of the neutral voltage, which is in-phase with the line voltage, the circuit of FIG. 4 would have produced an overestimate of the power consumed from the source. Thus by accomplishing down-scaling of the line voltage in two steps, the first step being a downscaling relative to neutral and the second step being relative to ground, an accurate scaling of the line voltage is achieved without injecting significant current into the equipment ground.

The scaled-down voltages from all phases of all power sources are sampled, AtoD converted and translated to a cosine and a sine value per cycle, exactly as explained above for current samples. Since power source voltages are expected to be of a stable nature, unlike load current which varies widely and may be zero, determining the phase drift and therefore frequency error of a source relative to the microprocessor's crystal controlled clock is best accomplished by processing the voltage samples. The accuracy of the microprocessor crystal is expected to be better than 20 parts per million, which means it would take 50,000 cycles, or about 800 seconds at 60 Hz, to drift one cycle. However, the frequency accuracy of the sources may not be so accurate. Utility grids are required to maintain frequency within +/−0.5 Hz but typical deviations are one tenth of that, namely +/−0.05 Hz. With a worst case error of +/−0.5 Hz, the complex voltage vector measured as described above would rotate through 360 degrees in two seconds or 120 cycles, and so cannot be averaged over long periods without correcting for this rotation rate. The phase drift is thus a worst case of +/−3 degrees per cycle. This is however low enough that the above Fourier analysis period could be extended to two or more cycles in length by accumulating the differences D1,D2,D3,D4 over more than one cycle if desired before calculating equations 3 and 4.

There are several methods to compensate for phase rotation of the measured currents and voltages. One way is to determine the rate of rotation.

If the complex voltage measurement yields a value (VR(i),VI(i)) for cycle number (i), where VR is the cosine component and VI is the sine component, then the the phase change from cycle i to cycle i+1 is given by $$d\phi = A\ \text{TAN}\ 2[VR(i+1)Vi(i) - VI(i+1)VR(i),\ VR(i+1)VR(i) + VI(i+1)VI(i)]$$

where A TAN 2 is the dual-argument Arctangent function for the angle of the vector (x,y). The frequency error is then given by $dw = d\phi/dt = 60\ d\phi$ radians per second when $dt = 1/60$ Hz or $30\ d\phi/\pi$ Hz.

The frequency discriminator equation (4) can be computed using cycles more than one apart providing the phase change over the interval will never approach or exceed 180 degrees. Results of equation 4 can be averaged over as many cycles as desired to give an accurate frequency error estimate. The average frequency error estimate can then be used to remove the phase rotation per cycle from successive cycles of current or voltage measurements. Removal of phase drift during averaging can be accomplished through carrying the previous complex average result forward and complex-multiplying it by $\text{Exp}(j\ d\phi)$ where $d\phi$ is the phase drift per cycle. This aligns it in phase with the next cycle's complex value enabling it to be coherently combined to form an updated average.

While the invention may comprise such a means as just discussed to assess the frequency accuracy of sources to see if they are out of bounds, there is a simpler means to account for frequency error while averaging voltages and currents.

One equation for computing instantaneous power is $$P = I \cdot V^* \quad (6)$$

where I and V are the one-cycle complex current and voltage measurements respectively and * means complex conjugate. The complex conjugate of V rotates in the opposite direction with frequency error to the direction in which I rotates, thus keeping the vector value of P static, and thus capable of being averaged or accumulated without drift correction to obtain an accurate mean power value or cumulative energy use value. Moreover, the derotated value I can be obtained by dividing P by the magnitude of V. The magnitude of V is given by $$|V| = \sqrt{V \cdot V^*}. \quad (7)$$

Thus an equation for derotated instantaneous current that is capable of being averaged is $$I = I \cdot V^* / \sqrt{V \cdot V^*}. \quad (8)$$

Provided that the voltage is not fluctuating rapidly or by a large amount, equation (8) does not need to be computed every cycle. Instead, the value of |V| may be averaged or accumulated over 60 samples over one second for example, and likewise the value of P from equation 6 may be averaged or accumulated over 60 cycles, and the ratio of the 1-second averages or accumulations only need be computed by equation (8) once per second.

Since the invention is concerned with measuring electrical parameters of systems connected to two or more sources of power that may selected at any time to power any load, the computation of average or cumulative parameters should be truncated for any load when its power source selection is changed, and a new average computation initialized or old cumulative calculation for the selected source resumed using the voltage of the newly selected source to combine with the load current. Thus the software computations of average load current and power or cumulative energy consumption and even of instantaneous current and power are deliberately synchronized with the switching of power source from one source to another. Accurate synchronization is facilitated when it is the same processor that affects source switching as performs the power calculations. In the case of FIG. 1, each breaker circuit may be selected to be powered from either the utility grid or from a solar inverter by controlling selection relays (3003). An internal software variable remembers the last programmed state of relays (3003) and therefore indicates for each load whether it is powered from the utility grid or solar. This variable is made accessible to the software routines that compute equations (6) or (8) so that the appropriate voltage is selected to combine with each load current measurement and so that the result may be averaged or accumulated in the correct bin, namely a "utility grid" average or cumulative bin or a "solar" average or cumulative bin.

In order to properly synchronize the different functions carried out by software, a specific software structure is used in which different hardware such as relays and AtoD converters are controlled by device-specific Device Control Programs that run only when needed to perform the following two exemplary types of task:

(1) Alter the hardware status
(2) Respond to a query about hardware status or hardware generated data The structure of a Device Control Program, or DCP for short, is typically as shown in FIG. 5. Requests to perform a task are communicated by creating a Device Control Block (DCB) which is entered into a queue for the specified device by a common queuing routine. Every DCB for every device has a 4-byte area comprising a 16-bit placeholder for a Link address for linking to another DCB in a chain or linked list of DCBs; a one byte placeholder for a "callerID" that indicates the process number requesting the task, and a one byte "Reply" that is used for two purposes: On input, it indicates whether the calling process desires to be suspended until completion of the requested task or not. On output at completion, it indicates to the calling process that the task has been completed. The rest of the DCB contains device-specific arguments such as relay driver control codes or, in the case of the AtoD converter DCP, may indicate a buffer address to receive the results.

The calling program prepares the DCB and then passes its address as an argument to a common utility program "QUEUER" along with the device number for which it is intended QUEUER looks at the queue for that device and if no other DCB is at the head of queue (i.e. the variable Head_of_Queue is zero) then it places the DCB address in the Head_of_Queue variable, marks the calling program as inactive if the Reply byte so requested, marks the DCP of the called device active, and then performs a reschedule in which the highest priority process will be awarded the CPU cycles while the state of the running process is saved for later resumption. There are many variations of rescheduling strategies, such as only scanning to determine the highest priority active process if that is not obvious, but a description of all possible real time operating system algorithms is beyond the scope of the current application as it is very dependent on the choice of processor.

If on the other hand QUEUER detects a DCB at the head of queue already, it places the address of the new DCB in the placeholder Link of the DCB at the end of the current, non-empty queue where it will be dealt with in turn.

FIG. 5 depicts a suitable real-time operating system structure. Data structure (100) illustrates the Head-Of-queue variable that is an element of an operating system array, there being one element per process, whether it is a hardware device or merely a calculating program. Each process has a process/device number, and its Head-Of-Queue variable is accessed by addressing the array using the process/device number as an index. The 16-bit Head-Of-Queue variable either contains 0000(hex) if the queue is empty or else it contains the address of the DCB at the head of the queue. It therefore points to the first DCB to be served. The link word or first two bytes of the DCB contain either 0000(hex) if there are no other DCBs in the queue, or else it contains the address of the next DCB in line. It therefore points to the next DCB, forming as linked list with the last DCB in the queue having 0000(hex) in its link word.

Device-dependent code (200) shows the device control program (DCP) structure for processing DCBs. Upon power up, each DCP in turn is entered at a power-up initialization entry point and performs device-dependent initialization tasks that can be relegated to a subroutine call to keep the structure even more alike between different DCPs. The DCP is then deactivated (suspended) until it is reactivated by its Head-of-Queue variable becoming non-zero. When that happens, the code is resumed from where it left off and moves on to get the DCN indicated by the address at its Head-of-Queue variable. It then performs the task indicated by the arguments passed to it in the DCB by the calling process and then exits by calling common code (300) which is a routine called "NEXTDCB" that performs a number of standard functions common to all DCPs, namely, it returns a value to the caller in the REPLY byte indicative of completion (or otherwise, if other potential conditions can arise), sets the calling process to active it the original value of the REPLY byte had requested suspension, and then transfers the link address from the DCB just processed into the Head-of-Queue variable. The code then returns to examining whether the queue is empty or not.

Even when a process is not a hardware device, but just a computing routine, it can be useful to utilize the software structure of FIG. 5 to communicate data between processes. The reason is that when a result computed by one program comprises more than one byte of data that is desired to be a read by another process, there has to be a way to ensure that a partially processed result is not read. This is assured by passing the computing process a DCB that requests a result, the computing process only testing the queue and replying to the request when computing is complete, thus ensuring that partially computed results are not returned. For example, the relay driver program may process requests to change relay states, of which there are 16, the states therefore occupying two bytes. The power computation program requires to know the relay states in order to combine currents with the correct voltages to determine power. Thus the power computation program may pass a DCB to the relay driver DCP requesting the state. This will be dealt with after any other DCBs that may be requesting relay state change, thereby guaranteeing that the correct instantaneous relay state is returned. Every process or software context that may be required to run at times unrelated to the times at which other processes run is preferably conformed to the software structure of a DCP as in FIG. 5. It is also desirable that every hardware device or chip that cannot be used simultaneously by two asynchronous users be driven by a DCP. An example of this is a 3-to-8 line converter chip such as a 74HC138. Such a chip may be used to convert three digital output lines from a processor into one of eight enables for devices attached to the SPI port. For example, in an exemplary apparatus according to FIGS. 1 to 5 there may be two AT-Tlnies communicating with the ATMEGA main processor using the SPI port, four TPL9201 relay driver chips, a real-time clock-calendar chip and a flash memory for archiving events such as power failure and electrical parameters averaged over various time periods from 15 minutes to one year. Each of the above eight devices has an associated DCP. When the DCP needs to send data to or receive data from its device, it first needs to set the 74HC138 to generate the appropriate enable signal so that the device is the only active device on the SPI port. To avoid conflict between different DCPs all wanting to control the same 74HC138 at possibly the same time, it too may be configured as a device controlled by a DCP, and requests for its use are lodged by queuing a DCB to control it. The DCB passes a request parameter to set it to a given state and mark it as busy, until the calling DCP releases it. The 74HC138 DCP grants its use to the calling DCP via an indication in the REPLY byte. When the calling DCP is finished using the chip, it releases it by canceling the busy signal thus allowing any subsequent DCB issued by a different calling DCP to be serviced.

It has thus been described above how to monitor the electrical parameters of multiple loads of branch circuits such as voltage, current, power, power factor and cumulative energy consumption from each source of power when a branch circuit can be powered from one or more sources, and the sources are not necessarily synchronized in phase or frequency, and the sources can experience outages. This desirable function is achieved by use of low-cost microprocessors which are operable even when only one phase of one power source is alive, the microprocessors generating and using their own reference clock which is nominally equal to the frequency of the electrical power sources or an integer multiple thereof such that operation continues uninterrupted when either power source fails, and by use of efficiently implemented complex arithmetic to perform digital signal processing operations that remove the frequency or phase error or drift between the self-generated reference clock and the power sources to produce accurate average values of the electrical parameters. Many variations in the exemplary clock and crystal frequencies, sample rates and digital word lengths may be made by a person of average skill in the art without departing from the spirit and scope of the invention as described by the attached claims.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

I claim:

1. A system for monitoring electrical parameters of electrical loads or branch circuits, at least one of which may be powered at different times by a selected one of at least two AC power sources of nominally a same frequency, comprising:

a clock generator operative to generate a local reference clock of nominally the same frequency as said at least two power sources or an integral multiple thereof;

current sensors operative to sense an instantaneous current flowing in said loads or branch circuits and produce corresponding voltage waveforms;

voltage scaling circuits operative to scale a voltage input from each of said at least two voltage sources to produce corresponding scaled voltages;

analog to digital conversion circuits operative to convert said corresponding voltage waveforms and said scaled voltages to numerical values representing current and voltage measurement values at multiple samples per cycle, the AtoD conversion being triggered and synchronized by said clock generator;

microprocessor circuits operative to control selection of one of said at least two power circuits to power at least one of said loads or branch circuits and to process said numerical values to obtain a complex number representing a phase and amplitude of a current or voltage over one or more power frequency cycles, said microprocessor circuits combining the complex number representative of a current value in a load or branch circuit with the complex value representative of a voltage value of the source selected to power said load or branch circuit in order to obtain an average or cumulative value of an electrical parameter of the load or branch circuit, and a power supply operative to convert power input from any or all of said at least two power sources or any phase thereof to a voltage suitable for powering said clock.

2. The system of claim 1 wherein said parameters include for any branch circuit any of:

a complex current, a current magnitude, a phase of a current relative to a driving voltage, a voltage of either of said at least two power sources or any phase thereof, a power, a power factor, a average values of any of the foregoing over any number of power frequency cycles or time periods, a cumulative energy consumed from a first of said at least two power sources over any time period, a cumulative energy consumed from a second of said at least two power sources over any time period and a average frequency error of any of said at least two power sources relative to said local reference clock over any time period.

3. The system of claim 1 wherein one of said at least two power sources is any one of:

a electric utility grid, a generator or an inverter driven by solar-derived energy.

4. The system of claim 1 wherein said clock generator is a microprocessor comprising a clock oscillator that is a high integer multiple of the nominal frequency of said at least two power sources and a divider operative to divide the frequency of said clock oscillator by an integer to produce said local reference clock.

5. The system of claim 1 wherein said current sensors comprise one of a pickup coil operative to produce a voltage related to the sensed instantaneous current, and a Hall Effect sensor.

6. The system of claim 1 wherein said voltage scaling circuits scale down a power voltage by using a first potentiometer chain between live and neutral and using a second potentiometer chain between an output of the first potentiometer chain and ground to produce said scaled voltage.

7. The system of claim 1 wherein said AtoD conversion is performed by one or more microprocessors having internal AtoD converters and analog multiplexers.

8. The system of claim 1 wherein said microprocessor circuits operative to control the selection of one of said at least two power circuits to power said at least one or load or branch circuit by outputting a control byte to one or more relay driver circuits and store the control byte or bytes in memory as an indicator of the power source selected for said at least one branch circuit.

9. The system of claim 1 wherein said microprocessor circuits process said numerical values to obtain a complex number representing the phase and amplitude of a current or voltage over one or more power frequency cycles by calculating a fundamental Fourier component of said numerical values.

10. The system of claim 1 wherein said microprocessor circuits combine the complex number representative of a current value in a load or branch circuit with the complex value representative of the voltage value of the source selected to power said load or branch circuit by reading a software variable indicative of the power source selection state for said load or branch circuit; retrieving the complex number representing the voltage measured for the power source indicated to be selected by said software variable and multiplying the complex number representative of the current flowing in said load or branch circuit by the complex conjugate of the complex number representative of the selected source voltage.

11. The system of claim 1 wherein said power supply comprises a diode rectifier operative to half-wave rectify an AC signal from each phase of each power source and parallel the half-wave rectified signals to produce a diode-ORed rectified voltage operative to power electronic circuits of the system.

* * * * *